(12) United States Patent
Tao (10) Patent No.: US 6,528,393 B2
(45) Date of Patent: Mar. 4, 2003

(54) METHOD OF MAKING A SEMICONDUCTOR PACKAGE BY DICING A WAFER FROM THE BACKSIDE SURFACE THEREOF

(75) Inventor: Su Tao, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 09/921,890

(22) Filed: Aug. 6, 2001

(65) Prior Publication Data

US 2001/0055856 A1 Dec. 27, 2001

(51) Int. Cl.[7] .................. H01L 21/301; H01L 21/46; H01L 21/78
(52) U.S. Cl. ................... 438/460; 438/113; 438/462
(58) Field of Search ...................... 438/64, 68, 113, 438/114, 460–465

(56) References Cited

U.S. PATENT DOCUMENTS

| 5,323,051 | A | 6/1994 | Adams et al. |
| 5,925,936 | A | 7/1999 | Yamaji |
| 6,004,867 | A | 12/1999 | Kim et al. |
| 6,107,164 | A | 8/2000 | Ohuchi |
| 6,297,131 | B1 * | 10/2001 | Yamada et al. ............. 438/464 |
| 2002/0024628 | A1 * | 2/2002 | Walker et al. .............. 349/155 |

* cited by examiner

Primary Examiner—Matthew Smith
Assistant Examiner—Craig P. Lytle
(74) Attorney, Agent, or Firm—Dykema Gossett PLLC (57) ABSTRACT

A method of dicing a wafer from the back side surface thereof comprises the steps of: providing a wafer having an active and a back side surface, the active surface of the wafer having a plurality of scribe lines defining individual chips; forming a through structure corresponding to the scribe lines on the active surface of the wafer; and dicing the wafer from the back side surface of the wafer according to the through structure as positioning reference marks.

31 Claims, 9 Drawing Sheets

METHOD OF MAKING A SEMICONDUCTOR PACKAGE BY DICING A WAFER FROM THE BACKSIDE SURFACE THEREOF

BACKGROUND OF THE INVENTION

1. Field of the Invention

This invention relates to a method of making a semiconductor package, and more specifically to a method of making a semiconductor package by dicing a wafer from the back side surface thereof.

2. Description of the Related Art

As electronic devices have become more smaller and thinner, the velocity and the complexity of IC chip become more and more higher. Accordingly, a need has arisen for higher packaging efficiency. Demand for miniaturization is the primary catalyst driving the usage of advanced packages such as chip scale packages (CSP) and flip chips. Both of them greatly reduce the amount of board real estate required when compared to the alternative ball grid array (BGA) and thin small outline package (TSOP). Typically, a CSP is 20 percent larger than the chip itself. The most obvious advantage of CSP is the size of the package; that is, the package is slightly larger than the chip. Another advantage of CSP is that the package facilitates test and burn-in before assembly as an alternative to known good die (KGD) testing. In addition, CSP can combine many of the benefits of surface mount technology (SMT), such as standardization, encapsulation, surface mount, and reworkability, with the benefits of flip chip technology, such as low inductance, high I/O count, and direct thernmal path.

However, as compared with conventional BGA or TSOP, CSP has the disadvantage of higher manufacturing cost. However, this problem could be eliminated if the chip-sized packages could be mass produced more easily. Therefore, the semiconductor packaging industry has tried to develop mass production techniques at the wafer-level for manufacturing the chip-sized packages, as illustrated in U.S. Pat. No. 5,323,051, U.S. Pat. No. 5,925,936 and U.S. Pat. No. 6,004,867.

For the methods of making the chip scale package disclosed in U.S. Pat. No. 5,323,051and U.S. Pat. No. 5,925,936, the methods substantially comprise the steps of: a) encapsulating an active surface of a wafer; b) grinding the encapsulated wafer to expose the bumps on the active surface of the wafer and to obtain the predetermined thickness; and c) dicing the encapsulated wafer according to the exposed bump as positioning reference marks.

In the above mentioned patents, the exposed bumps are utilized as the positioning reference marks for dicing the encapsulate wafer. But the exposed bumps of the individual chip or dice is too tiny to provide an obvious positioning reference mark which is easily detected by the positioning device of the dicing machine or apparatus. Hence, the positioning device of the dicing machine or apparatus is often positioned with errors.

U.S. Pat. No. 6,004,867, entitled "Chip-size Package Assembled Using Mass Production Techniques At The Wafer-Level" issued on Dec. 21, 1999 to Kim et al., discloses a chip-size package technique at the wafer level, wherein a substrate is attached to an active surface of a packaged wafer, the substrate includes grooves or index patterns corresponding to the scribe lines, and the grooves or index patterns in the substrate will be exposed by grinding such that the exposed grooves or index patterns are utilized as positioning reference marks for dicing the wafer. However, according to the process of the invention, the wafer requires additional attachment of the substrate for dicing, which fails to fully meet the requirements of chip scale package.

Moreover, due to the demand for miniaturization and high operating velocity, it is more desirable to apply the multi-chip package to a variety of electronic devices. The multi-chip package assembles two or more chips into a single package, so as to minimize the limitation of the operative speed of the electronic system. Besides, the multi-chip package would shorten the length of wires between bumps to reduce the signal delay and I/O time.

Typical multi-chip package is side-by-side multi-chip package in which two or more chips are set side-by-side on a main surface of a common substrate. The electrical connections between the chips and the common substrate are usually achieved by wire bonding. However, the side-by-side multi-chip package has the disadvantage of low packaging efficiency because the area of the common substrate would increase as the number of chips increases.

Hence, Taiwan Patent Application. 089109786, entitled "Stacked Multi-chip Package", filed on May 19, 2000 by this applicant, discloses a stepped chip structure wherein the stepped chip can be attached on another chip to form a multi-chip package. According to the invention, two chips are stacked on a multi-chip module substrate such that the bottom of the upper chip would not contact with the loop profile of the bonding wire of the lower chip so as to overcome the disadvantage of prior stacked chip package. However, the above mentioned patent application did not provide a suitable method or process to dice the wafer to obtain the stepped chip structure.

Moreover, in the prior technique, the cavity down configuration is well known and is widely applied in ball grid array (BGA) package. But the prior technique did not provide a suitable stacking method and structure for the cavity down configuration to package a plurality of chips on the same area of the substrate.

Therefore, a need exists for a semiconductor package that provides a method for dicing wafer so as to overcome the above mentioned drawback.

SUMMARY OF THE INVENTION

It is a primary object of the present invention to provide a method of dicing a wafer from the back side surface thereof so as to accurately dice the wafer into individual dices or chips.

It is a secondary object of the present invention to provide a method of dicing a wafer from the back side surface thereof for mass producing chip-size package at the wafer-level so as to reduce the cost of manufacturing chip-size package.

It is another object of the present invention to provide a method of dicing a wafer from the back side surface thereof for forming a stepped chip structure.

It is still another object of the present invention to provide a method of dicing a wafer from the back side surface thereof for forming a cavity down configuration chip structure.

In order to achieve the objects mentioned hereinabove, there is provided a method of dicing a wafer from the back side surface thereof. According to the present invention, the method comprises the steps of:

a) providing a wafer having an active and a back side surface, the active surface of the wafer having a plurality of scribe lines defining individual chips;

b) forming a through structure corresponding to the scribe lines on the active surface of the wafer; and c) dicing the wafer from the back side surface of the wafer according to the through structure as positioning reference marks.

According to one aspect of the present invention, the through structure is composed of two grooves perpendicular to each other.

According to another aspect of the present invention, the through structure is a plurality of indented grooves on the perimeter of the wafer.

According to a further aspect of the present invention, the through structure is a lacuna.

According to a further aspect of the present invention, the method of dicing a wafer from the back side surface thereof further comprises the steps of encapsulating the wafer with molding compound and grinding the molding compound and the back of the wafer before the step of dicing the wafer to form a chip-size package.

According to another further aspect of the present invention, the method of dicing a wafer from the back side surface thereof further comprises the step of forming slots on the back side surface of the wafer with a wider width before the dicing process so as to form a stepped chip structure having an outer tier and a central tier.

According to another further aspect of the present invention, the method of dicing a wafer from the back side surface thereof further comprises the step of forming cavities on the back side surface of the wafer before the dicing process so as to form a chip having a cavity down configuration.

According to the present invention, the through structure on the back side surface of the wafer are able to provide obvious positioning reference marks to accurately and rapidly dice the wafer into individual dices or chips in the dicing process. Moreover, the method of dicing a wafer from the back side surface thereof according to the present invention also provides the stepped chip and the cavity down chip for forming a multi-chip package.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

The present invention relates to a method of mass producing chip-size package at the wafer-level so as to reduce the cost of manufacturing chip-size package. Now the preferable embodiments according to the present invention will be described in detail while taken in conjunction with the accompanying drawings. In the accompanying drawings, like reference numbers represent corresponding parts throughout.

For the purpose of description and not intended to limit the present invention, the term "through structure" as used herein refers to a hollow structure through the wafer, this structure includes, but not limited to, a through hole, and grooves, a lacuna and indented grooves on the edge of the wafer.

Figure 1A:
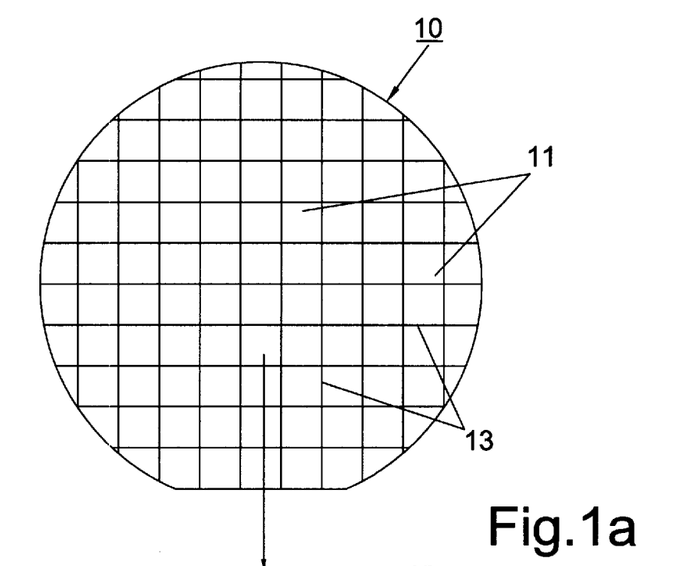
FIG. 1a is a plan view showing a wafer of a first embodiment according to the present invention.
Figure 1B:
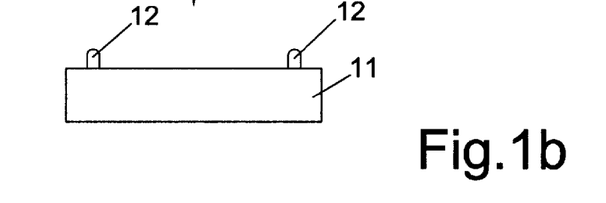
FIG. 1b is a partially enlarged sectional view of the chip shown in FIG. 1.

FIG. 1a depicts a top plan view of a wafer 10 according to the present invention. The wafer 10 has a plurality of chips 11 and scribe lines 13 which are located between the chips 11. FIG. 1b is a partially enlarged sectional view of the chip 11 shown in FIG. 1a, wherein each of the chips 11 is provided with a plurality of electrodes 12 on the active surface thereof. The electrodes 12 are formed by electroplating on the electrode terminals of the chips 11, and the electrodes 12 are made of conductive metal material, such as solder or gold, which can be connected with a substrate by soldering.

Figure 2:
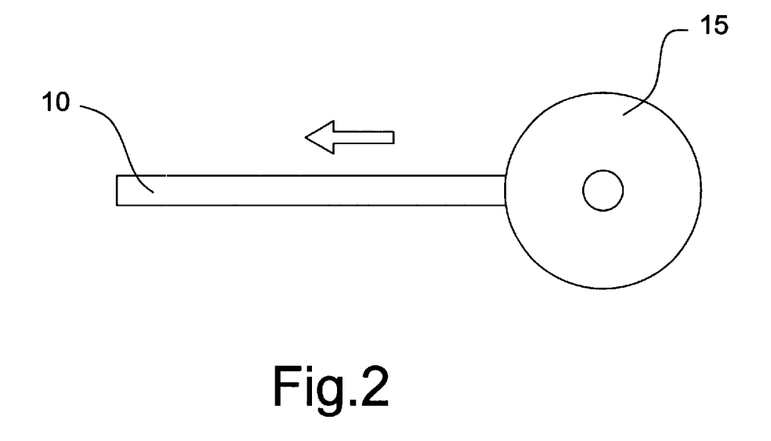
FIG. 2 is a schematic view showing the process of the embodiment according to the present invention for cutting the wafer so as to form the indented grooves.
Figure 3A:
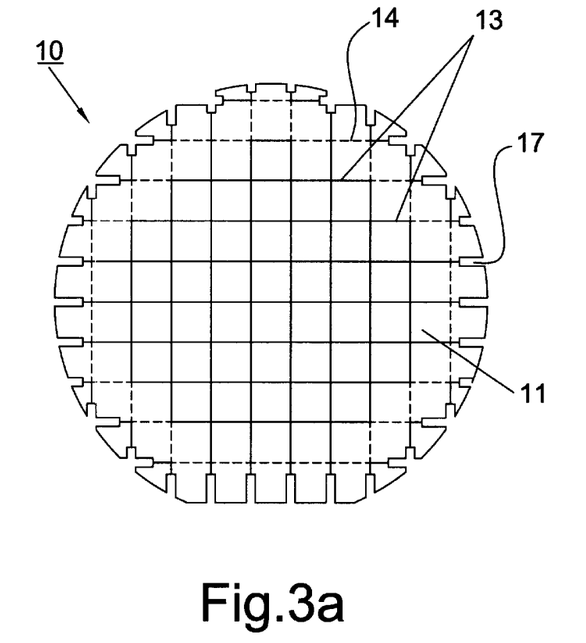
FIG. 3a is a top plan view of the wafer of the embodiment according to the present invention with the indented grooves
Figure 3B:
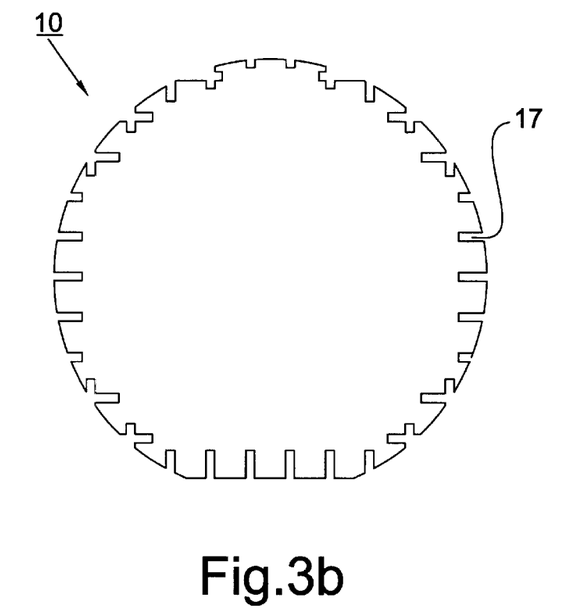
FIG. 3b is a bottom plan view of the wafer of the embodiment according to the present invention with the indented grooves

Now referring to FIG. 2, a blade 15 is used for cutting the periphery of the wafer 10 alone the scribe lines 13 so as to form a plurality of indented grooves 17. As illustrated in FIGS. 3a and 3b, they respectively show the top plan view and the bottom plan view of the wafer 10 after the indented grooves 17 are formed, wherein the scribe lines 13 on the active surface of the wafer 10 and the indented grooves 17 through the wafer 10 are visible, while only the indented grooves 17 on the back side of the wafer 10 are visible. Also, the indented grooves 17 would not interfere with the effective chip range of the wafer 10 (the area enclosed by dash line 14 shown in FIG. 3a), and thus the effective chip range of the wafer 10 can keep its entirety.

After forming the indented grooves 17 in the wafer 10, the active surface of the wafer 10 is usually encapsulated with molding compound 21. The molding compound 21 will cover the scribe lines 13 on the active surface of the wafer 10, so the subsequent dicing process could not use the scribe lines 13 on the active surface of the wafer 10 as positioning reference marks for accurately and rapidly positioning and cutting.

Figure 4:
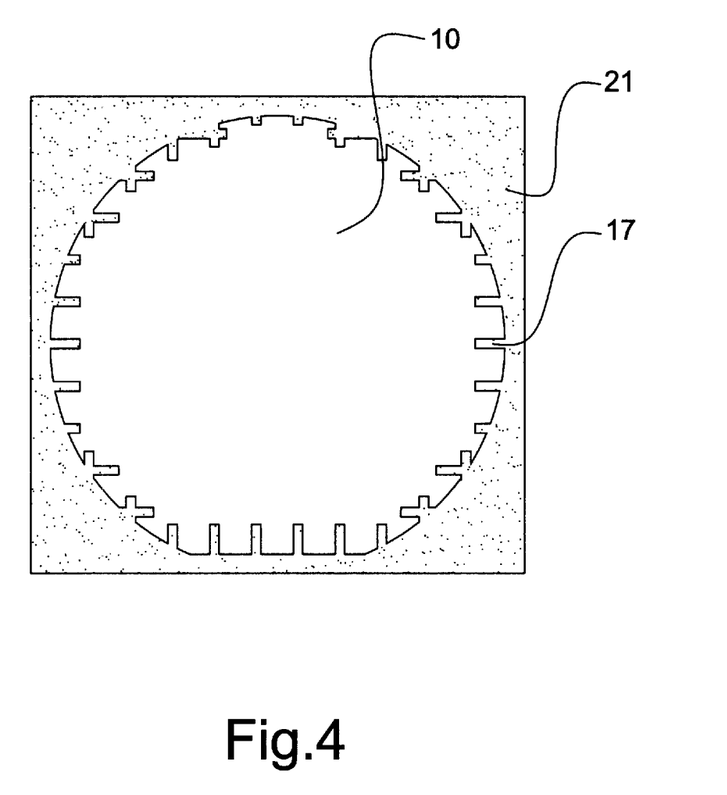
FIG. 4 is a bottom plan view showing the wafer of the embodiment according to the present invention with the molding compound encapsulating thereon.

Referring to FIG. 4, it depicts that the wafer 10 according to the first embodiment of the present invention is encapsulated with the molding compound 21 by molding process. It should be noted that those skilled in this art will appreciate that the wafer 10 can be encapsulated by alternative processes, such as dispensing process, underfill dispensing process, and transfer molding process. According to the method of the present invention, there is an apparent interface between the molding compound 21 and the wafer 10, and thus the grooves 17 would become an apparent reference marks.

Figure 5:
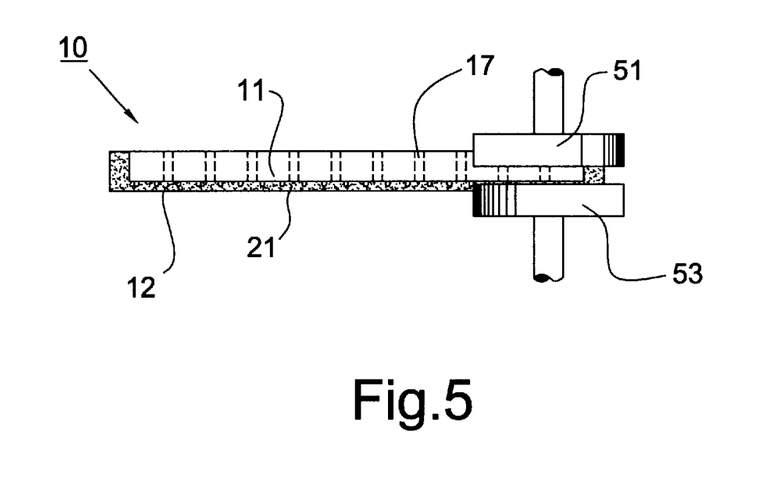
FIG. 5 is a side schematic view showing the grinding process of the embodiment according to the present invention, in which the wafer is ground by two grinding wheel.

Referring to FIG. 5, those skilled in this art will appreciate that, before the dicing process, the molding compound 21 on the active surface of the wafer 10 could be ground by a grinding wheel 53 so as to expose the electrodes 12 of the wafer 10, and the back side surface of the wafer 10 could be ground by an another grind wheel 51, so as to reduce the thickness of the wafer 10 to a predetermined thickness.

Figure 6:
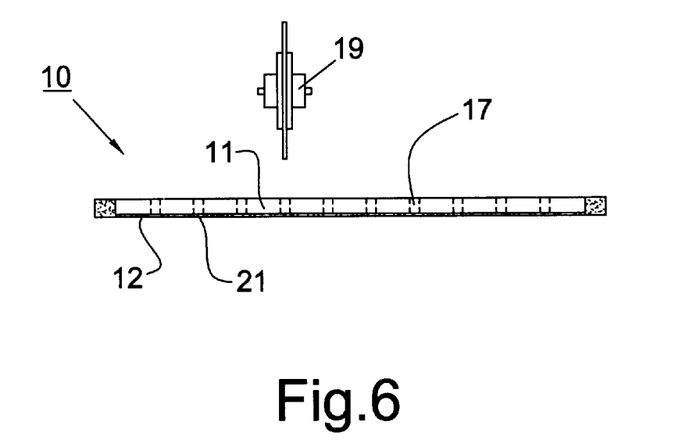
FIG. 6 is a side schematic view of the wafer showing the dicing process of the embodiment according to the present invention.
Figure 7:
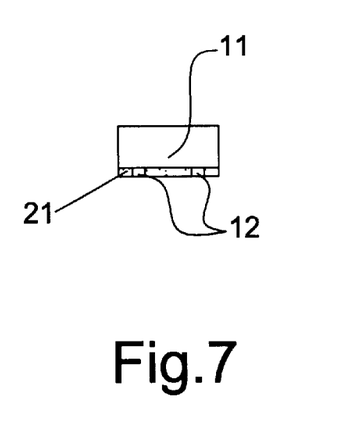
FIG. 7 is a side schematic view of the chip formed by dicing the wafer of the embodiment according to the present invention.

Now referring FIG. 6, the wafer 10 is diced by a blade 19 from the back side surface thereof. As illustrated, the blade 19 will dice the wafer 10 to form individual chips 11 (as illustrated in FIG. 7) according to the indented grooves 17 as positioning reference marks.

Figure 8:
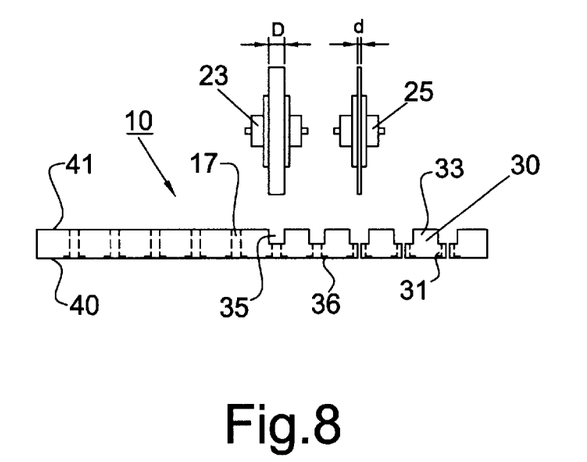
FIG. 8 is a side schematic view of a wafer showing the process of second embodiment according to the present invention, in which the wafer is cut by two blades with different width.
Figure 9:
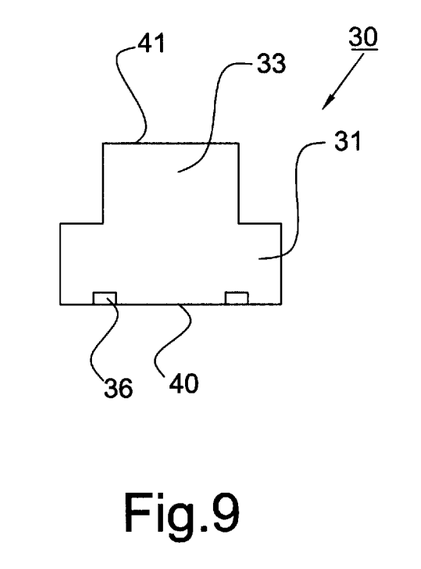
FIG. 9 is a side schematic view of the chip formed by the process of the second embodiment according to the present invention illustrated in FIG. 8.

Now referring FIGS. 8 and 9, which illustrate the second embodiment according to the present invention, the chips 30 of the wafer 10 have an active surface 40, a back side surface 41, and bump pads 36, wherein the wafer 10 is cut by a blade 23 with a wider width D along the indented grooves 17 to form slots 35 after the indented grooves 17 are formed, and the slots 35 do not penetrate the wafer 10. Then, another blade 25 with a narrow width d is used to dice the wafer 10 to form the individual chips 30 according to the indented grooves 17 as reference marks.

Now again referring to FIG. 9, the chip 30 according to the second embodiment of the present invention defines an out tier 31 and a central tier 33. Such chips 30 can be applied for forming multi-chip stacked structure. The multi-chip stacked structure is disclosed in Taiwan Patent Application No. 089109786 entitled "Stacked Multi-chip Package", filed on May 19, 2000 by this applicant, which is incorporated herein by reference.

Figure 10:
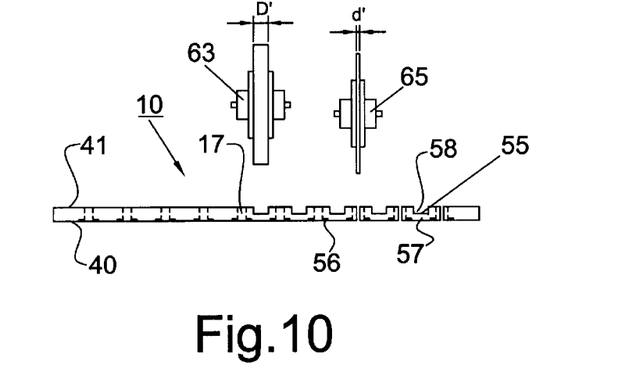
FIG. 10 is a side schematic view of a wafer showing the process of a third embodiment according to the present invention, in which the wafer is cut by two blades with different width.
Figure 11:
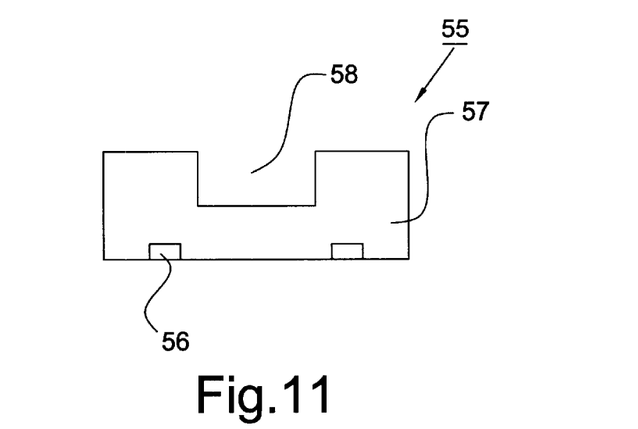
FIG. 11 is a side schematic view of the chip formed by the process of the third embodiment according to the present invention illustrated in FIG. 10.
Figure 12:
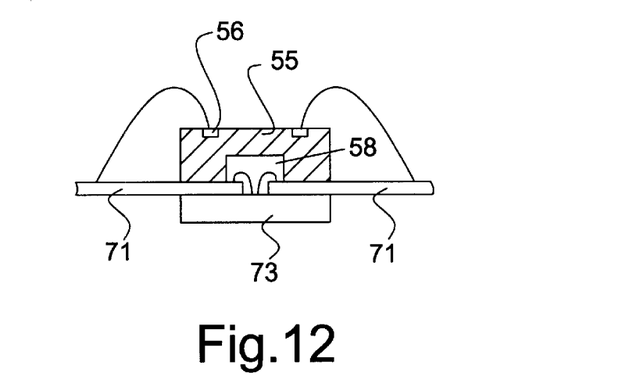
FIG. 12 is a side schematic view of the chip formed by the process of the third embodiment according to the present invention illustrated in FIG. 10 showing the chip attached to a substrate.

Now referring FIGS. 10, 11 and 12, which illustrate the third embodiment according to the present invention, the chips 50 of the wafer 10 have an active surface 40, a back side surface 41, and bump pads 56, and the wafer 10 is cut by a blade 63 with a wider width D' along the line between the indented grooves 17 to form slots 58 after the indented grooves 17 are formed, wherein the slots 35 do not penetrate the wafer 10. Then, another blade 25 with a narrow width d' is used to dice the wafer 10 to form the chips 55 according with the indented grooves 17 as reference marks.

Now again referring to FIGS. 11 and 12, the chip 55 according to the third embodiment of the present invention defines a body portion 57 and a notch portion 58. As illustrated in FIG. 12, the chip 55 can be attached to a substrate 71 having cavity down configuration, wherein the substrate 71 further comprises a chip 73, and the notch portion 58 of the chip 55 can be used for receiving the molding compound encapsulating the chip 73 so as to form a multi-chip stacked package.

Now referring to FIGS. 13–16, they depict the fourth embodiment according to the present invention. As shown in FIG. 2, the blade 15 is used for cutting the periphery of the wafer 10 along the scribe lines 13 so as to form two grooves and further to form a lacuna 75(as shown in FIGS. 13a and 13b). As illustrated in FIGS. 13a and 13b, they respectively show the top plan view and the bottom plan view of the wafer 10 after the lacuna 75 are formed, wherein the scribe lines 13 on the active surface of the wafer 10 and the lacuna 75 through the wafer 10 are visible, while only the lacuna 75 on the back side of the wafer 10 are visible. Also, the wafer 10 in this embodiment has a smaller effective chip range (the area enclosed by dash line 14a shown in FIG. 13a) than that of the embodiment shown in FIG. 3a, but the lacuna 75 can shrink to adapt for the wafer of the embodiment shown in the FIG. 3a.

Figure 13A:
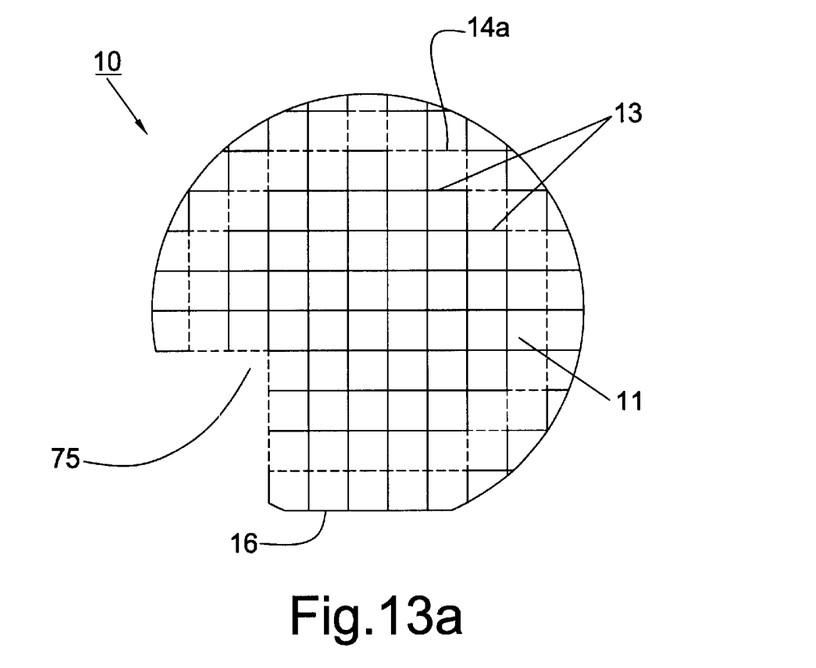
FIG. 13a is a top plan view of the wafer of a fourth embodiment according to the present invention with the indented grooves.
Figure 13B:
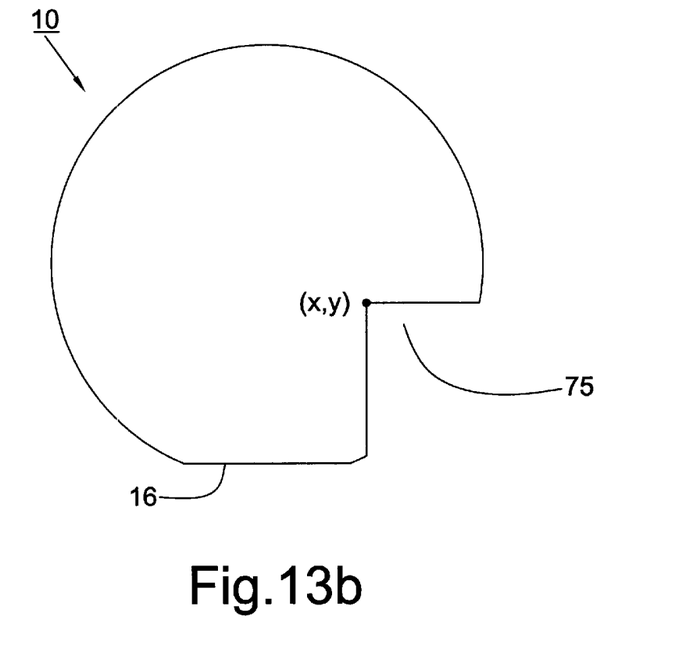
FIG. 13b is a bottom plan view of the wafer of the fourth embodiment according to the present invention with the indented grooves

After forming the lacuna 75 in the wafer 10 in the chip scale semiconductor package, the active surface of the wafer 10 is usually encapsulated with molding compound 21. The molding compound 21 will cover the scribe lines 13 on the active surface of the wafer 10, so the subsequent dicing process could not use the scribe lines 13 on the active surface of the wafer 10 as positioning reference marks for accurately and rapidly positioning and cutting.

Figure 14:
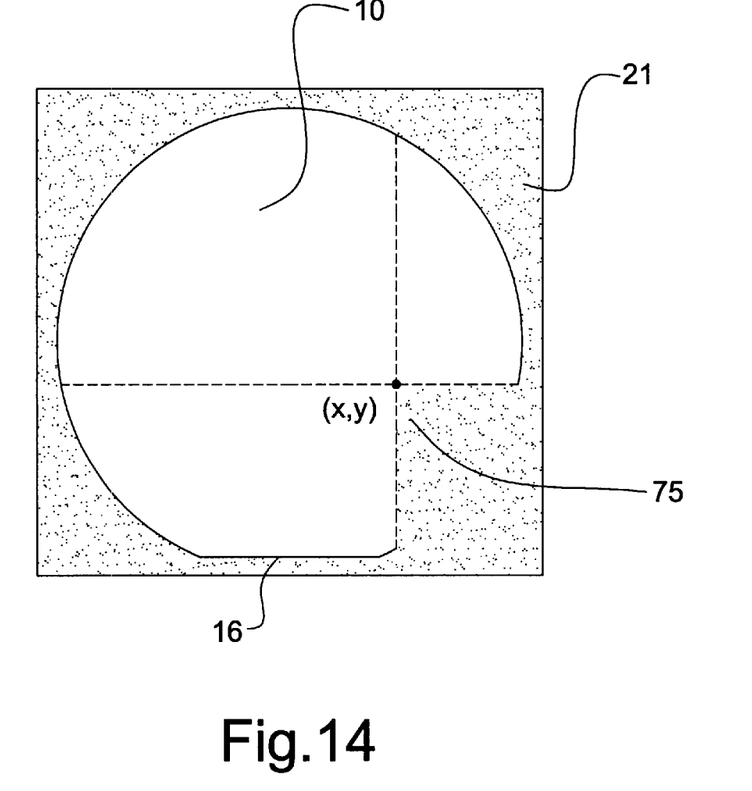
FIG. 14 is a bottom plan view showing the wafer of the fourth embodiment according to the present invention with the molding compound encapsulating thereon.

Referring to the FIG. 14, it depicts that the wafer 10 according the fourth embodiment of the present invention is encapsulated with the molding compound 21 by molding process. It should be noted that those skilled in this art will appreciate that the wafer 10 can be encapsulated by alternative processes, such as dispensing process, underfill dispensing process, and transfer molding process. According to the method of the present invention, there is an apparent interface between the molding compound 21 and the wafer 10 on the back side surface of the wafer 10, and thus the lacuna 75 would become an apparent reference marks. Moreover, a typical wafer 10 has a chamfer 16, and thus the wafer 10 can be positioned in a two dimensional coordinate system by the chamfer 16 and the lacuna 75. As shown in FIG. 14, the reference coordinate (x, y) of the lacuna 75 relative to the chamfer 16 can be defined.

According to the fourth embodiment, the lacuna 75 has two side edges perpendicular to each other and coincided with the scribes 13. However, those skilled in this art will appreciate that, in fact, providing any through structure corresponding to the scribe line on the active surface can define a reference position relative to the chamfer of the wafer. For example, the through structure can be a through hole drilled by a drill on the wafer 10 corresponding to the scribe line.

Figure 15:
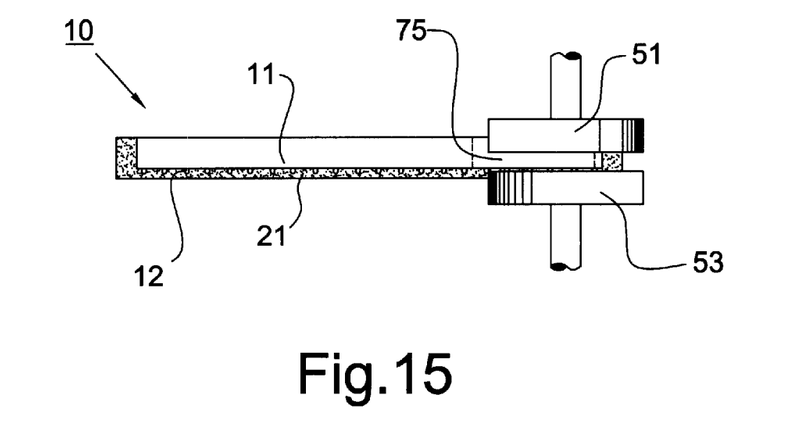
FIG. 15 is a side schematic view showing the grinding process of the fourth embodiment according to the present invention, in which the wafer is ground by two grinding wheel.

Referring to FIG. 15, those skilled in this art will appreciate that, before the dicing process, the molding compound 21 on the active surface of the wafer 10 could be ground by a grinding wheel 53 so as to expose the electrodes 12 of the wafer 10, and the back side surface of the wafer 10 could be ground by an another grind wheel 51, so as to reduce the thickness of the wafer 10 to a predetermined thickness.

Figure 16:
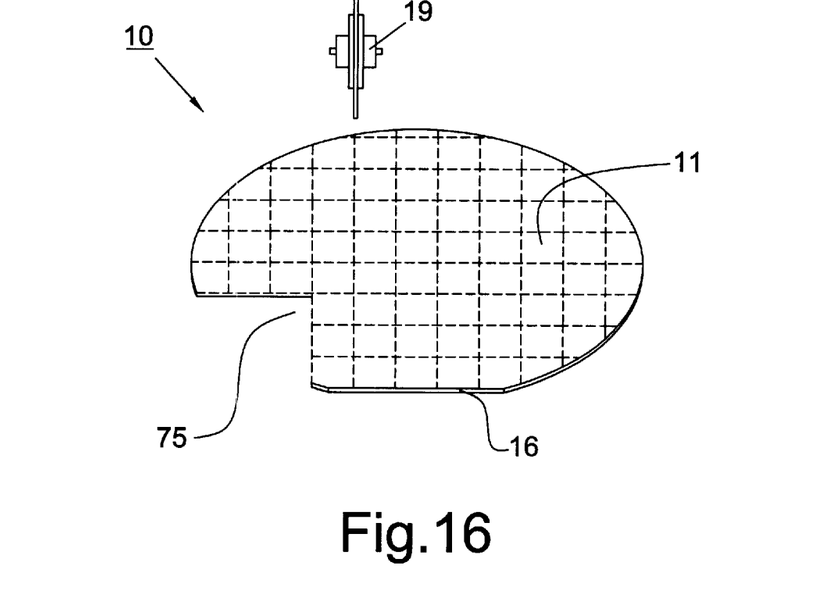
FIG. 16 is a side schematic view of the wafer showing the dicing process of the fourth embodiment according to the present invention.

Now referring FIG. 16, it depicts that the wafer 10 is diced by a blade 19 from the back side surface thereof. The blade 19 will dice the wafer 10 with a predetermined distance (as the dash lines illustrated in FIG. 16) to form individual chips 11 (as illustrated in FIG. 7) according to the two dimensional coordinate system defined by the lacuna 75 and the chamfer 16. It should be noted that those skilled in the art will appreciate that the dice 11 shown in the FIG. 16 is generally square in shape, but the dice 11 also can be rectangular in shape, and even the sizes of the dice 1I1 on the wafer 10 can be different.

Figure 17:
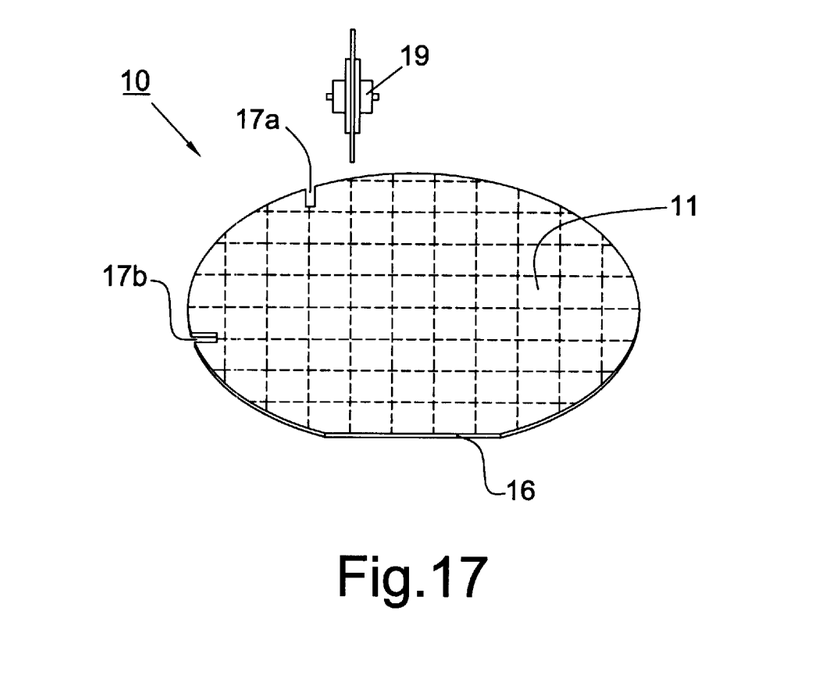
FIG. 17 is a side schematic view of the wafer showing the dicing process of a fifth embodiment according to the present invention.

Now referring FIG. 17, it depicts the fifth embodiment according to the present invention. The through structure on the wafer 10 is two grooves 17a, 17b corresponding the scribe lines of the active surface of the wafer and locating on the periphery of the wafer 10. The wafer 10 can be dicing according to the reference positioning marks defined by the two grooves 17a, 17b.

As described in the foregoing descriptions, according to the method of dicing a wafer from the back side surface thereof of the present invention, the through structures, such as a through hole, indented grooves and lacuna on the back side surface of the wafer are able to provide positioning reference marks for dicing the wafer accurately and rapidly in the dicing process. Moreover, according to the method of dicing a wafer from the back side surface of the wafer of the present invention, it also provides the stepped chip and the chip with a notch for forming a multi-chip package.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of dicing a wafer from the back side surface thereof comprising the steps of:
   a) providing a wafer having an active and a back side surface, the active surface of the wafer having a plurality of scribe lines defining individual chips;
   b) forming a through structure corresponding to the scribe lines on the active surface of the wafer; and
   c) dicing the wafer from the back side surface of the wafer according to the through structure as positioning reference marks.

2. The method of claim 1, wherein the through structure is two grooves perpendicular to each other.

3. The method of claim 2, wherein the two perpendicular grooves are formed by the blade cutting along the scribe lines on the active surface of the wafer.

4. The method of claim 1, wherein the through structure is a plurality of indented grooves on the perimeter of the wafer.

5. The method of claim 4, wherein the indented grooves are formed by the blade cutting along the scribe lines on the active surface of the wafer.

6. The method of claim 1, wherein the through structure is a lacuna.

7. The method of claim 6, wherein the lacuna is formed by a blade cutting along the scribe lines on the active surface of the wafer.

8. The method of claim 1, wherein the through structure is a through hole.

9. A method of manufacturing a chip scale package at wafer lever comprising the steps of:
   a) providing a wafer having an active and a back side surface, the active surface of the wafer having a plurality of scribe lines defining individual chips, and each chip having a plurality of electrodes;
   b) forming a through structure corresponding to the scribe lines on the active surface of the wafer;
   c) encapsulating the wafer with molding compound and the through structure being also fully filled with the molding compound;
   d) grinding the back of the wafer to a predetermined thickness; and
   e) dicing the wafer from the back side surface of the wafer according to the molding compound filled in the through structure as positioning reference marks.

10. The method of claim 9, wherein the through structure is two grooves perpendicular to each other.

11. The method of claim 10, wherein the two perpendicular grooves are formed by the blade cutting along the scribe lines on the active surface of the wafer.

12. The method of claim 9, wherein the through structure is a plurality of indented grooves on the perimeter of the wafer.

13. The method of claim 12, wherein the indented grooves are formed by the blade cutting along the scribe lines on the active surface of the wafer.

14. The method of claim 9, wherein the through structure is a lacuna.

15. The method of claim 14, wherein the lacuna is formed by a blade cutting along the scribe lines on the active surface of the wafer.

16. The method of claim 9, wherein the through structure is a through hole.

17. The method of claim 9, wherein the grinding step is conducted by using a mechanical polishing process.

18. The method of claim 9, further comprising a step of grinding the molding compound to expose the electrodes from the molding compound.

19. The method of claim 9, wherein the encapsulating step is conducted by using a dispensing process.

20. The method of claim 9, wherein the encapsulating step is conducted by using a molding process.

21. The method of claim 20, wherein the encapsulating step is conducted by using a transfer molding process.

22. A method of dicing a wafer from the back side surface of the wafer comprising the steps of:
   a) providing a wafer having an active and a back side surface, the active surface of the wafer having a plurality of scribe lines defining individual chips;
   b) forming a through structure corresponding to the scribe lines on the active surface of the wafer with a first blade;
   c) forming a plurality of slots on the back side surface of the wafer with a second blade according to the through structure as positioning reference marks; and
   d) dicing the wafer from the back side surface of the wafer according to the through structure as positioning reference marks with a third blade, wherein the width of the third blade is narrower than that of the second blade so as to form a stepped chip having an outer tier and a central tier.

23. The method of claim 22, wherein the through structure is two grooves perpendicular to each other.

24. The method of claim 22, wherein the through structure is a plurality of indented grooves on the perimeter of the wafer.

25. The method of claim 22, wherein the through structure is a lacuna.

26. The method of claim 22, wherein the through structure is a through hole.

27. A method of dicing a wafer from the back side surface of the wafer comprising the steps of:
 a) providing a wafer having an active and a back side surface, the active surface of the wafer having a plurality of scribe lines defining individual chips;
 b) forming a through structure corresponding to the scribe lines on the active surface of the wafer with a first blade;
 c) forming a plurality of central slots on the back side surface of the wafer with a second blade according to the through structure as positioning reference marks; and
 d) dicing the wafer from the back side surface of the wafer according to the through structure as positioning reference marks with a third blade, wherein the width of the third blade is narrower than that of the second blade so as to form a chip having a notch at the central portion thereof.

28. The method of claim 27, wherein the through structure is two grooves perpendicular to each other.

29. The method of claim 28, wherein the through structure is a plurality of indented grooves on the perimeter of the wafer.

30. The method of claim 27, wherein the through structure is a lacuna.

31. The method of claim 27, wherein the through structure is a through hole.

* * * * *